United States Patent [19]
Pascente

[11] 4,075,510
[45] Feb. 21, 1978

[54] THYRISTOR VOLTAGE SWITCHING CIRCUITS

[76] Inventor: Joseph E. Pascente, 71 Regent Drive, Oak Brook, Ill. 60521

[21] Appl. No.: 724,326

[22] Filed: Sept. 17, 1976

[51] Int. Cl.² .................... H03K 17/72; H03K 17/08
[52] U.S. Cl. ................................. 307/252 B; 361/56
[58] Field of Search ......... 307/252 B, 252 N, 252 Q, 307/202; 323/23, 24; 361/56, 91

[56] References Cited
U.S. PATENT DOCUMENTS

| | | | |
|---|---|---|---|
| 3,360,713 | 12/1967 | Howell | 307/252 B |
| 4,006,367 | 2/1977 | Ott | 307/252 B |

Primary Examiner—John Zazworsky
Attorney, Agent, or Firm—Gary, Juettner & Pyle

[57] ABSTRACT

Improved thyristor voltage switching circuits for connecting an a.c. voltage across a load are characterized by means for protecting the thyristors when in the off state against line voltage transients of an amplitude in excess of breakdown voltages thereof.

In one embodiment of the invention, the thyristors are triacs connected in series to increase their overall voltage withstand capability. In another embodiment, circuitry is connected to sense the voltage between anode and cathode terminals of triacs, and to apply a signal to gate terminals thereof to render the triacs conductive whenever the anode to cathode voltage is in excess of the breakdown voltage. In this manner, surge currents are conducted across the entire junction areas of the triacs as compared with point areas, and destruction of the triacs is prevented.

7 Claims, 4 Drawing Figures

THYRISTOR VOLTAGE SWITCHING CIRCUITS

BACKGROUND OF THE INVENTION

The present invention relates to thyristor voltage switching circuits, and in particular to improved thyristor voltage switching circuits which are protected when in their off state against transient line voltages of an amplitude in excess of the breakdown voltages of the thyristors.

Solid-state relays for switching a.c. voltages are often used in applications such as traffic control equipment, furnace heater controls, motor controls and the like. Such relays are customarily four terminal devices (two input terminals and two output terminals), and use thyristor (SCR or triac) devices to switch an a.c. line voltage between the two output terminals in response to a signal across the two input terminals. The signal may be applied across the input terminals either by semiconductor logic or reed relays, and is ordinarily timed to switch the thyristor on when the a.c. line voltage is at its zero-crossing point to avoid a current surge therethrough. When the input signal is removed, the thyristor regains its blocking state and becomes nonconductive when the line voltage passes through its zero-cross point.

Such solid-state relays offers many advantages over their mechanical counterparts, the electromechanical relays. For example, with the solid-state relay there are no moving parts and no contact bounce. Further, the relay is capable of fast operation, is shock and vibration resistant, and does not emit audible noise when operated.

Unfortunately, there are certain disadvantages to such relays, the most troublesome of which is the inherent resistance of the thyristor, when in its off state, to line voltage transients. Line voltages normally encountered are not clean sine waves, and superimposed thereon are transient voltage spikes from motors, solenoids, electromechanical relays, lightning, switches, etc. A thyristor has a finite off state breakdown voltage rating, and must be protected from such transients. If not so protected, upon the occurrence of a transient voltage of an amplitude in excess of the breakdown voltage rating of the thyristor, the thyristor may be permanently damaged and thereafter fail to block voltage or turn off. This occurs, when the thyristor is off, as a result of a surge current passing through a point area of the thyristor junction upon a breakdown thereof.

Many solid-state relays use a triac as the voltage switching device. While a triac is capable of handling relatively large line currents when in its conductive state, it is readily destroyed when in its nonconductive state by transient line voltages of an amplitude in excess of its breakdown voltage. Conventional attempts to protect triacs against transient voltages include shunt-type circuit devices connected across the triacs between the anode and the cathode terminals thereof. Such shunt devices may include metal oxide varistors or zener diodes connected back-to-back and selected to conduct at a point when the voltage across the triac is above the nominal value of the switched voltage, but below the triac breakdown voltage. The devices are intended, when the triac is in its off state, to conduct and shunt surge current around the triac upon the occurrence of a voltage transient, to thereby protect the triac.

Such devices are useful in protecting triacs. However, the devices have an inherent resistance, and triacs are thus nevertheless often destroyed by the occurrence of line transients of an amplitude sufficient to generate across the devices, and therefore across the triacs, voltages in excess of the breakdown voltages of the triacs. Furthermore, as the devices are repeatedly stressed by the occurrence of large amplitude line transients, failure of the devices frequently occurs with attendant subsequent failure of the triacs.

OBJECTS OF THE INVENTION

Accordingly, it is an object of the present invention to provide improved thyristor voltage switching circuits capable of withstanding transient voltages of a magnitude significantly in excess of the thyristor breakdown voltages.

It is another object of the invention to provide such switching circuits wherein the thyristor operates to smother large amplitude voltage transients which occur when the thyristor is nonconductive.

It is a further object of the present invention to provide such circuits wherein a nonconductive thyristor is momentarily rendered conductive upon the occurrence of a voltage transient of a magnitude in excess of its breakdown voltage.

SUMMARY OF THE INVENTION

In accordance with the present invention, a thyristor voltage switching circuit includes means for protecting a thyristor thereof against voltages having an amplitude in excess of the thyristor breakdown voltage.

In one embodiment of the invention the switching circuit selectively connects an a.c. voltage across a load, the voltage having a nominal value and occasionally having imposed thereon transient voltages of greater amplitude than the nominal value. The thyristor is a triac for being connected with its anode and cathode terminals in series with the load and the voltage, and having a nonconductive breakdown voltage of a value greater than the nominal value but less than the value of the transient voltages. A metal oxide varistor is connected between the anode and the gate of the triac, and is responsive to become conductive to render the triac conductive when voltage therebetween, and therefore between the anode and cathode, is in excess of a predetermined value which is greater than the nominal value but less than the breakdown value.

As a consequence, upon the occurrence of a transient voltage of greater amplitude than the predetermined value, the metal oxide varistor conducts to render the triac conductive to the transient voltage, and to thereby limit the voltage across the anode and cathode thereof to less than the breakdown voltage. This prevents destruction of the triac.

In a second embodiment of the invention, a pair of triacs are connected together at their anodes, with their cathodes for being connected in series with a load and an a.c. voltage having a nominal value less than the combined value of the triac breakdown voltages. A metal oxide varistor is connected between the gates of the triacs, and conducts to render the triacs conductive whenever the voltage across their cathodes is of a predetermined value greater than the nominal value but less than the combined value of their breakdown voltages. This circuit arrangement has the advantage of (a) switching a voltage having twice the nominal value as that switched by a single triac, and (b) remaining nonconductive upon the occurrence of transients which would otherwise cause the single triac to become conductive, since the a.c. voltage and transients imposed thereon are equally divided between the two triacs.

Another embodiment of the invention contemplates connecting two triacs in series as aforesaid, but without a metal oxide varistor connected between the gates thereof. Since as connected the voltage is divided equally across the triacs, the triacs can switch and sustain without damage twice the voltage of a single triac.

The invention thus provides improved thyristor voltage switching circuits capable of switching, without damage, voltage having imposed thereon transient voltages of an amplitude in excess of the breakdown voltages of the triacs.

The foregoing objects are thus attained with particular facility. Other objects, advantages and features of the invention will become apparent from a consideration of the following detailed description, when taken in conjunction with the appended drawings.

DETAILED DESCRIPTION

In accordance with the present invention, there are provided improved thyristor voltage switching circuits, for connecting an a.c. voltage across a load, which are effectively and efficiently protected against destruction by large amplitude transient voltages.

Prior Art

Figure 1:
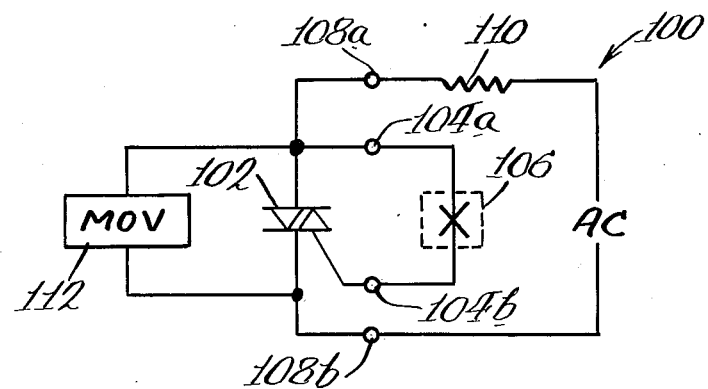
FIG. 1 shows a typical prior art thyristor voltage switching circuit which is protected in a conventional manner against transient line voltages.

To best appreciate the novel and improved structure and operating characteristics of the various switching circuits of the invention, reference is first made to FIG. 1 which shows a typical prior art thyristor voltage switching circuit, indicated generally at 100, having a thyristor 102 which is protected against transient line voltages in a conventional manner. The illustrated thyristor is a triac, and is connected at its gate-anode to circuit input terminals 104a and 104b for having its conductively controlled by the state of a control device, which as illustrated comprises a switch 106. The anode-cathode of the triac is connected to circuit output terminals 108a and 108b, whereby the traic selectively connects an a.c. voltage across a load 110, shown as a resistor, in accordance with the state of the control device. For simplicity, the control device is represented as a single switch contact which is operable to interconnecting the input terminals to render the triac conductive (on), or to disconnect the input terminals to render the triac nonconductive (off) when the voltage passes its zero-cross point. In practice, the control device may comprise semiconductor logic or a reed relay, the operation of which is ordinarily timed to switch the triac on when the a.c. voltage is at its zero-cross point to avoid a surge current through the triac.

Line voltages normally encounted in industrial applications of such circuits are ordinarily not clean sine waves. Rather, superimposed on the voltage are relatively large amplitude voltage transients or spikes from such devices as motors, solenoids, etc., or from lighting strikes on the line. When the triac 102 is conductive, it has a relatively low impedance and the transients pass harmlessly therethrough without generating a significant voltage drop thereacross. When the triac is nonconductive, however, it has a relatively high impedance and the full amplitude of the transient voltage is applied thereacross. The triac has a finite breakdown voltage, and where the amplitude of the transient exceeds this breakdown voltage the triac may be destroyed.

In an attempt to protect the triac against large amplitude transient line voltages, the prior art teaches connecting a shunt device between the cathode and the anode of the triac. The shunt device is selected to be nonconductive to nominal line voltages switched by the triac, and conductive to a line voltage of a predetermined value which is greater than nominal but less than the breakdown voltage of the triac. Such a shunt device is shown as a metal oxide varistor (MOV) 112, but may just as readily be a pair of back-to-back zener diodes or other device which accomplishes the required function.

With the triac switched off and with a nominal value a.c. line voltage applied across the output terminals 108a and 108b, both the triac and the shunt device are nonconductive. Upon the occurrence of line voltage transients of an amplitude in excess of the predetermined value, the shunt device conducts before the breakdown voltage of the triac is reached and shunts the transients around the triac to limit the voltage across the triac to less than its breakdown voltage. The shunt device, however, has an inherent resistance to a flow of current therethrough, and upon the occurrence of a sufficiently large amplitude transient the voltage thereacross, and therefore across the triac, may exceed the breakdown voltage of the triac, resulting in destruction of the triac despite the shunt device. Furthermore, failure of the shunt device often results from repeated stressing by line transients, resulting in attendant destruction of the triac.

The Invention

To overcome the disadvantages of such prior art thyristor voltage switching circuits, the present invention for the first time takes advantage of the fact that the thyristor is quite capable of harmlessly passing therethrough, and thereby smothering, a large amplitude transient line voltage if it is conductive during the occurrence of the transient. When the thyristor is nonconductive, a transient voltage in excess of its breakdown voltage causes a surge current to flow through a point area of the thyristor junction, resulting in destruction of the thyristor. However, when the thyristor is conductive, the surge current passes harmlessly through the entire junction area thereof.

Figure 2:
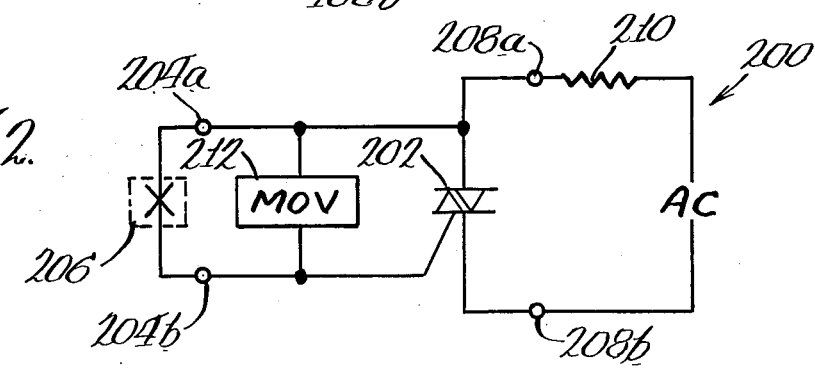
FIG. 2 illustrates a thyristor voltage switching circuit which is protected against large amplitude transient line voltages in accordance with one embodiment of the invention.

Referring to FIG. 2, there is shown a thyristor voltage switching circuit, generally indicated at 200, in accordance with one embodiment of the present invention. The circuit includes a triac 202 connected at its gate-anode to circuit input terminals 204a and 204b for having its conductivity controlled by the state of a control device, which as illustrated comprises a switch 206. The anode-cathode of the triac is connected to circuit input terminals 208a and 208b for selectively switching an a.c. voltage across a load 210, shown as a resistor, in accordance with the state of the control device which may also be, as for FIG. 1, a reed relay or a semiconductor logic circuit. To this point, the circuit is identical with the prior art circuit of FIG. 1.

The circuit of FIG. 2, however, differs significantly in structure and operation from that of the prior art in the particular manner in which a shunt device, shown as an MOV 212, is connected with the triac. Instead of being connected between the anode-cathode of the triac as in the prior art, the MOV is connected between the gate-anode thereof. This enables the MOV to sense and be rendered conductive by the voltage across the anode-cathode of the triac, since the voltage at the gate is substantially equal to the voltage at the cathode. When the MOV is rendered conductive, however, a significantly different circuit function results as compared with the prior art circuit. With the triac nonconductive and with the MOV selected to conduct at the predetermined voltage which is greater than the nominal a.c. line voltage and less than the breakdown voltage of the triac, upon the occurrence of a transient voltage of a value in excess of the predetermined value the MOV conducts and provides current to the gate of the triac to turn on the triac. When conductive the triac is capable of conducting extremely high current for one-half cycle of operation, and it therefore passes the transient harmlessly therethrough. When the a.c. line voltage then passes through its zero-cross point the triac becomes nonconductive, so that its maximum conduction time in response to a transient voltage is one-half cycle of the a.c. voltage.

As a consequence of the MOV rendering the triac conductive upon sensing the predetermined voltage thereacross, a voltage in excess of the triac's breakdown voltage is never applied across the triac while it is nonconductive. Further, since conduction of the triac limits the maximum value of the voltage thereacross, and therefore across the MOV, to the predetermined value, the MOV is not stressed by high amplitude transient voltages and surge currents. To this end, it should be noted that the MOV, as a result of its extremely fast response time, is particularly suited for controlling the conductive state of the triac. The response time of the MOV is measured in nanoseconds, and the MOV renders the triac conductive in the relatively short period between the time the transient voltage reaches the predetermined value and before it reaches the breakdown voltage of the triac.

Figure 3:
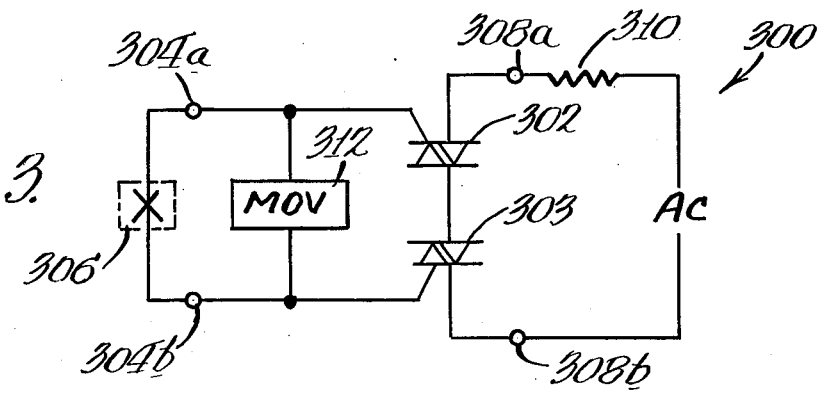
FIG. 3 illustrates a thyristor voltage switching circuit having protection against large amplitude transient line voltages in accordance with a second embodiment of the invention.

FIG. 3 illustrates a second embodiment of a thyristor voltage switching circuit, indicated generally at 300, embodying the principles of the invention. A pair of triacs 302 and 303 are connected together at their anodes, are connected at their gates to input terminals 304a and 304b for having their conductivity controlled by a control device, which as illustrated comprises a switch 306, and are connected at their cathodes to a pair of output terminals 308a and 308b for selectively switching an a.c. voltage across a load 310 in accordance with the state of the control device. An MOV 312 is connected between the gates of the triacs. This arrangement has the advantage of being capable of switching twice the line voltage of the single triac switching circuit of FIG. 2, since the voltage is divided between the triacs 302 and 303. As each triac has presented thereacross only one-half of the voltage to be switched, it is required that each have a nonconductive breakdown voltage between the anode and cathode electrodes thereof only of a value greater than one-half the nominal value of the switched voltage. The MOV, of course, senses the total voltage across the triacs since the voltage at their gates is essentially equal to the voltage at their cathodes, and since the voltage is divided across the triacs the MOV can be selected to render the triacs conductive at a transient voltage value twice as great as that for a single triac switching circuit. As a consequence, this switching circuit is rendered conductive by the MOV less frequently than the circuit of FIG. 2. Further, simultaneous triac turn on for protection of the triacs is ensured whether the triacs are turned on by the MOV or by the control circuit, since current flowing from the gate of one triac must simultaneously flow into the gate of the other triac.

Figure 4:
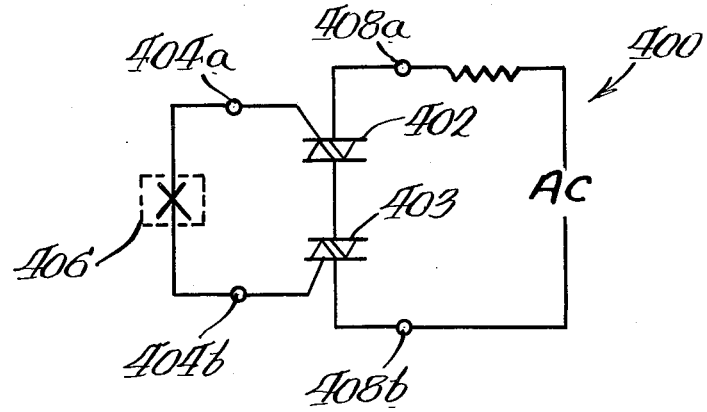
FIG. 4 illustrates a thyristor voltage switching circuit protected against large amplitude transient line voltages in accordance with a third embodiment of the present invention.

Referring to FIG. 4, a third embodiment of a thyristor voltage switching circuit, indicated generally at 400, includes a pair of triacs 402 and 403 connected together at their anodes, connected at their gates to input terminals 404a and 404b for having their conductivity controlled by a control device, which as illustrated comprises a switch 406, and connected between a pair of output terminals 408a and 408b for selectively switching an a.c. voltage across a load 410 in accordance with the state of the control device. This circuit is identical to that in FIG. 3, except that an MOV is not connected between the gates of the triacs. The circuit is capable of switching twice the line voltage and withstanding twice the amplitude of line voltage transients as a single triac unprotected switching circuit, and may be used in those situations where large value transient line voltages are not expected to occur (i.e., transients having twice the amplitude of the breakdown voltage of one of the triacs). Also, simultaneous triac turn on by the control device for protection of the triacs is ensured, since current flowing from the gate of one triac must simultaneously flow into the gate of the other triac.

The invention thus provides thyristor voltage switching circuits which are not destroyed by large amplitude transient line voltages. The circuits are characterized by conduction of the thyristors in response to destructive transient voltages, as compared with conduction of a shunt device connected across the thyristor, and by the connection of thyristors in series to double the overall voltage amplitude handling capacity thereof. As a consequence, the circuits are not harmed by the occurrence of voltages which would otherwise destroy prior voltage switching circuits.

While various embodiments of the invention have been described in detail, various modifications and other embodiments thereof may be devised by one skilled in the art without departing from the spirit and the scope of the invention, as defined by the claims.

What is claimed is:

1. In a voltage switching circuit, first and second semiconductor devices each having a pair of controlled electrodes, a control electrode for controlling conduction between said controlled electrodes, and a breakdown voltage rating between said controlled electrodes, one of said controlled electrodes of one said devices being connected with one of said controlled electrodes of the other said devices connecting said devices in series, the other controlled electrodes of said devices for being connected across a load and a source of voltage having a nominal value less than the combined value of said breakdown voltages, and means for sensing the voltage across said other controlled electrodes of said devices and for applying a signal to said control electrodes to establish conduction between said controlled electrodes of said devices whenever said voltage exceeds a predetermined value greater than said nominal value and less than the combined value of said breakdown voltages.

2. In a voltage switching circuit as set forth in claim 1, said control electrode of each of said first and second devices being coupled through said device to said other controlled electrode thereof and having a voltage thereat substantially equal in value to the voltage at said other controlled electrode, said sensing and applying means being a third semiconductor device having a pair of terminals and responsive to a voltage thereacross to establish a conductive path therebetween whenever said voltage is in excess of said predetermined value, said third semiconductor device being connected by said terminals between said control electrodes of said first and second devices.

3. In a voltage switching circuit as set forth in claim 2, wherein said first and second devices are first and second thyristors each having anode, cathode and gate electrodes, said controlled electrodes being said anode and cathode electrodes and said control electrodes being said gate electrodes, said anode electrodes of said thyristors being connected together and said cathode electrodes thereof for being connected across said load and said source of voltage, said terminals of said third device being connected between said gate electrodes.

4. In a voltage switching circuit as set forth in claim 3, said first and second thyristors being first and second triacs having said anode, cathode and gate electrodes, said third semiconductor device being a metal oxide varistor having a conduction voltage equal in value to said predetermined value.

5. In a voltage switching circuit as set forth in claim 4, means connected between said gate electrodes of said triacs for controllably establishing a circuit path therebetween, said triacs connecting said voltage across said load when said circuit path is established.

6. In a voltage switching network for selectively connecting an a.c. voltage having a nominal value across a load, said voltage occasionally having imposed thereon transient voltages of a value greater than said nominal value, first and second triacs each having anode, cathode and gate electrodes and a nonconductive breakdown voltage between said anode and cathode electrodes of a value greater than one-half said nominal value, said anode electrodes being connected together and said cathode electrodes for being connected across said load and said voltage, and a metal oxide varistor having a pair of terminals responsive to a voltage thereacross to establish a conductive path therebetween whenever said voltage is in excess of a predetermined value greater than said nominal value and less than the combined breakdown voltage values, connected by said terminals between said triac gate electrodes for having said a.c. voltage applied across said terminals, whereby upon the occurrence of a voltage across said cathode electrodes of greater value than said predetermined value said metal oxide varistor conducts to interconnect said triac gates to render said triacs conductive and to thereby limit said voltage across said triacs to less than said breakdown value.

7. In a voltage switching circuit as set forth in claim 6, means connected between said triacs gate electrodes for controllably establishing a circuit path therebetween whereby said triacs connect said a.c. voltage across said load when said circuit path is established.

* * * * *